(12) United States Patent
Morgan et al.

(10) Patent No.: US 6,790,786 B2
(45) Date of Patent: Sep. 14, 2004

(54) ETCHING PROCESSES FOR INTEGRATED CIRCUIT MANUFACTURING INCLUDING METHODS OF FORMING CAPACITORS

(75) Inventors: Paul A. Morgan, Kuna, ID (US); Patrick M. Flynn, Boise, ID (US); Janos Fucsko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 10/092,875

(22) Filed: Mar. 5, 2002

(65) Prior Publication Data

US 2003/0170961 A1 Sep. 11, 2003

(51) Int. Cl.[7] .............................................. H01L 21/302
(52) U.S. Cl. ...................... 438/754; 438/396; 438/650; 438/669; 438/691; 438/692; 438/693; 438/697; 438/704; 438/722; 438/689; 438/745; 438/748; 216/6; 216/16; 216/17; 216/100; 216/108; 216/109
(58) Field of Search ................................ 438/396, 650, 438/669, 691, 692, 693, 695, 697, 704, 722, 689, 745, 748, 754; 216/6, 16, 17, 100, 108, 109

(56) References Cited

U.S. PATENT DOCUMENTS

| 4,039,698 A | * 8/1977 | Fraser et al. ................. 438/669 |
| 6,144,871 A | * 11/2000 | Saito et al. .................. 600/395 |
| 6,290,736 B1 | * 9/2001 | Evans ......................... 438/692 |

FOREIGN PATENT DOCUMENTS

| DE | 4333935 | * 4/1995 | ............ B23H/3/00 |
| JP | 61-170580 | * 8/1986 | ............ C23F/1/00 |
| JP | 08-153707 | * 6/1996 | ........... H01L/27/04 |
| JP | 2001-240985 | * 9/2001 | ......... H01L/21/304 |

* cited by examiner

Primary Examiner—David A. Zerneke
Assistant Examiner—Lisa Kilday
(74) Attorney, Agent, or Firm—Wells St. John P.S.

(57) ABSTRACT

The invention includes semiconductor processing methods, including methods of forming capacitors. In one implementation, a semiconductor processing method includes providing a semiconductor substrate comprising a layer comprising at least one metal in elemental or metal alloy form. The metal comprises an element selected from the group consisting of platinum, ruthenium, rhodium, palladium, iridium, and mixtures thereof. At least a portion of the layer is etched in a halogenide, ozone and $H_2O$ comprising ambient.

59 Claims, 3 Drawing Sheets

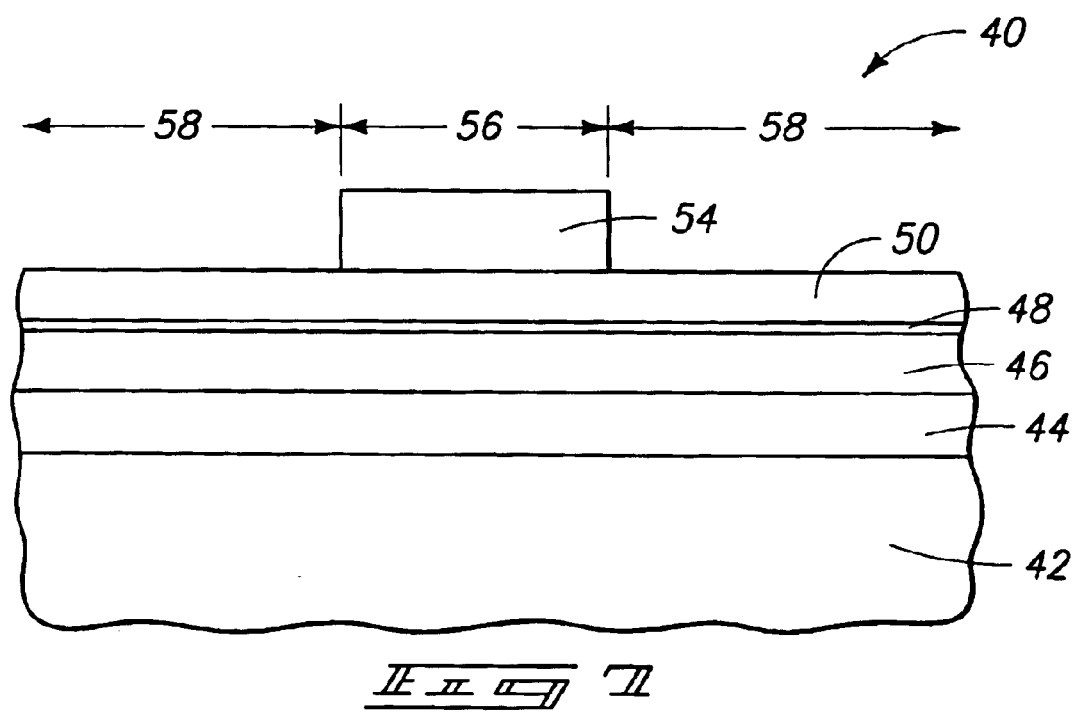
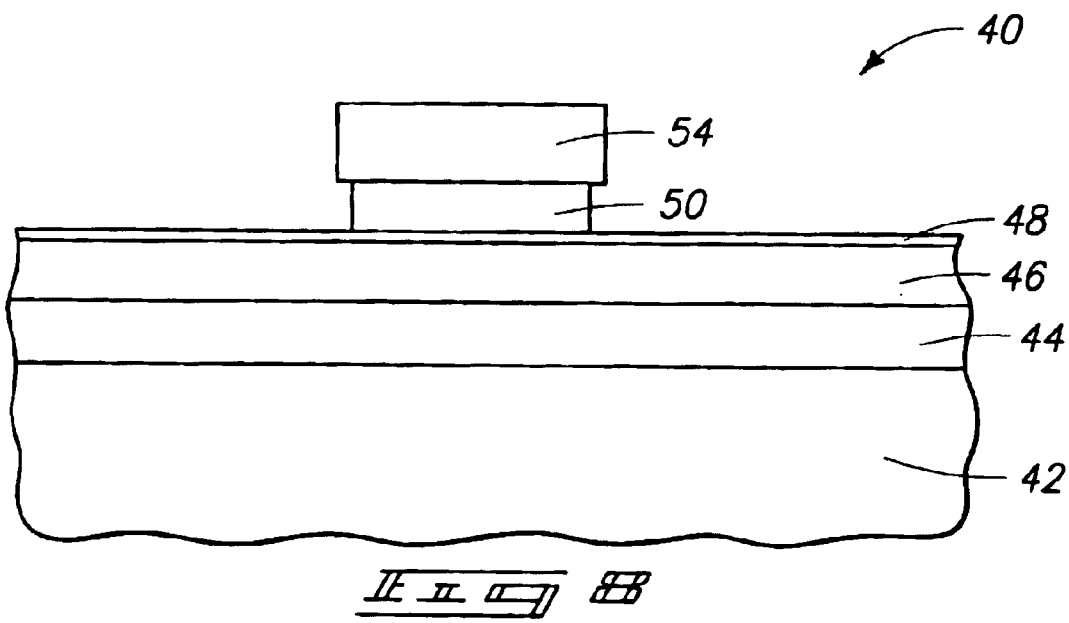

US 6,790,786 B2

ETCHING PROCESSES FOR INTEGRATED CIRCUIT MANUFACTURING INCLUDING METHODS OF FORMING CAPACITORS

TECHNICAL FIELD

This invention relates to semiconductor processing methods, and to methods of forming capacitors.

BACKGROUND OF THE INVENTION

One common goal in capacitor fabrication is to maximize the capacitance for a given size capacitor. It is desirable that stored charge be at a maximum immediately at the physical interface between the respective electrodes or capacitor plates and the capacitor dielectric material between the plates. Many integrated circuitry capacitors have electrodes or plates which are formed from doped semiconductive material such as polysilicon. The polysilicon is usually heavily doped to impart a desired degree of conductivity for satisfactory capacitor plate operation.

One drawback of heavily doping polysilicon is that during operation a charge depletion region develops at the interface where charge maximization is desired. Hence, a desired level of charge storage is achieved at a location which is displaced from the interface between the capacitor plate and the dielectric material. Another drawback of heavily doped polysilicon capacitor plates is that during processing, some of the dopant can migrate away from the polysilicon and into other substrate structures. Dopant migration can adversely affect the performance of such structures. For example, one type of integrated circuitry which utilizes capacitors are memory cells, and more particularly dynamic random access memory (DRAM) devices. Migratory dopants from doped polysilicon capacitor plates can adversely impact adjacent access transistors by undesirably adjusting the threshold voltages.

As the memory cell density of DRAMs increases there is a continuous challenge to maintain sufficiently high storage capacitance despite decreasing cell area. Additionally there is a continuing goal to further decrease cell area. The principal way of increasing cell capacitance heretofore has been through cell structure techniques. Such techniques include three dimensional cell capacitors such as trench or stacked capacitors.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Insulating inorganic metal oxide materials, such as $Ta_2O_5$ and barium strontium titanate, have high dielectric constants and low leakage current which make them attractive as cell dielectric materials for high density DRAMs and non-volatile memories. All of these materials incorporate oxygen and are otherwise exposed to oxygen and anneal for densification to produce the desired capacitor dielectric layer.

In many of such applications, it will be highly desirable to utilize metal for the capacitor electrodes, thus forming a metal-insulator-metal capacitor. In other applications, it may still be desirable to use polysilicon as part of the capacitor electrode material using a conductive or other diffusion barrier, such as platinum, to avoid formation of insulative oxides of the electrode material. Certain metal materials such as platinum are, however, extremely challenging to remove by chemical etching, or by chemical-mechanical polishing processes. It would therefore be desirable to provide improved methods of etching these materials.

While the invention was motivated from this perspective, it is in no way so limited to addressing or overcoming any aspect of this particular problem, however. The invention is seen to have applicability to any method of processing particular metal comprising layers utilizing any integrated circuitry construction. The invention is only limited by the accompanying claims appropriately interpreted in accordance with the doctrine of equivalents without limiting reference to the specification, with the specification herein only providing but exemplary preferred embodiments.

SUMMARY

The invention includes semiconductor processing methods, including methods of forming capacitors. In one implementation, a semiconductor processing method includes providing a semiconductor substrate comprising a layer comprising at least one metal in elemental or metal alloy. The metal comprises an element selected from the group consisting of platinum, ruthenium, rhodium, palladium, iridium, and mixtures thereof. At least a portion of the layer is etched in a halogenide, ozone and $H_2O$ comprising ambient.

In one implementation, a semiconductor processing method includes forming a layer comprising at least one metal in elemental or metal alloy form over at least one side of a semiconductor wafer. The metal comprises an element selected from the group consisting of platinum, ruthenium, rhodium, palladium, iridium, and mixtures thereof. The wafer has a central portion surrounded by a peripheral portion. Masking material is formed over the central portion of the layer while the peripheral portion is left outwardly exposed. The peripheral exposed portion of the layer is etched from the wafer using a halogenide, ozone and $H_2O$ comprising ambient while the masking material is received over the central portion.

In one implementation, a method of forming a capacitor includes forming first and second capacitor electrode layers separated by a capacitor dielectric region over a substrate. At least one of the capacitor electrode layers comprises at least one metal in elemental or metal alloy form, the metal comprising an element selected from the group consisting of platinum, ruthenium, rhodium, palladium, iridium, and mixtures thereof. Masking material is formed over a first portion of said at least one capacitor electrode layer while leaving a second portion of said at least one capacitor electrode layer exposed. The exposed second portion of said at least one capacitor electrode layer is etched using a halogenide, ozone and $H_2O$ comprising ambient while the masking material is received over the first portion effective to form a desired pattern of said at least one capacitor electrode layer.

BRIEF DESCRIPTION OF THE DRAWINGS

Preferred embodiments of the invention are described below with reference to the following accompanying drawings.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
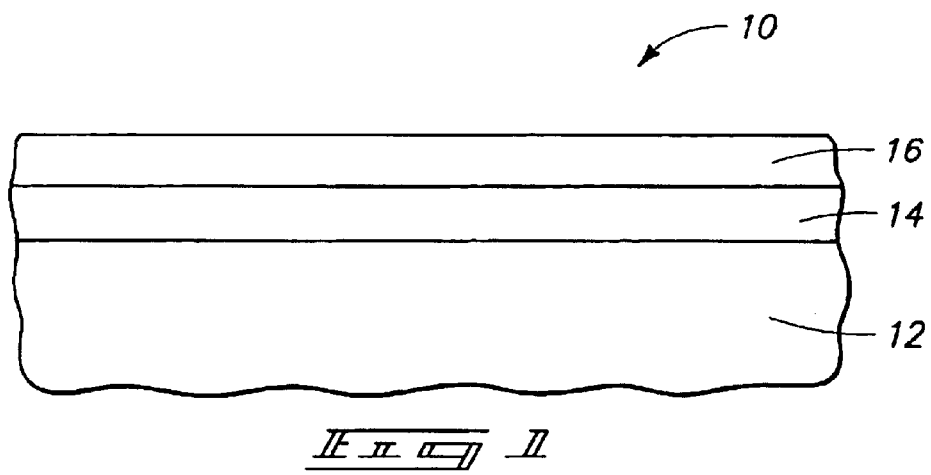
FIG. 1 is a diagrammatic perspective view of a semiconductor wafer fragment/section in process in accordance with an aspect of the invention.

One first preferred embodiment of a semiconductor processing method is described with reference to FIGS. 1 and 2. FIG. 1 depicts a semiconductor wafer fragment 10 comprising of bulk monocrystalline substrate 12 having an insulative layer 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the terms "layer" and "material" encompass both the singular and the plural unless otherwise indicated. Exemplary materials for layer 14 include doped and undoped silicon dioxide, and silicon nitride.

A layer 16 comprising at least one metal in elemental or metal alloy form is formed over semiconductor substrate 12/14. The metal comprises an element selected from the group consisting of platinum, ruthenium, rhodium, palladium, iridium and mixtures thereof. Layer 16 can be provided by any suitable deposition method, with sputtering or chemical vapor deposition being examples. The metal alloy formed with respect to the at least one metal may include another of the metals from the group consisting of platinum, ruthenium, rhodium, palladium and iridium, and/or a metal outside of the stated group. In one embodiment, layer 16 can consist essentially of the at least one metal in elemental or metal alloy form from the stated group. By way of example only, an exemplary alloy includes a platinum/rhodium alloy comprising approximately 80% rhodium and 20% platinum, by weight. Further by way of example only, other metal alloys employing metals from the stated group include an iridium-rhodium alloy and a platinum-iridium alloy.

Figure 2:
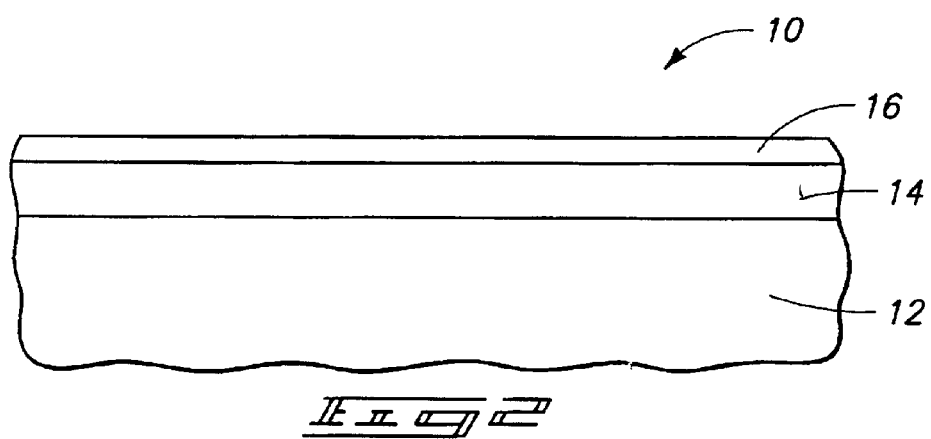
FIG. 2 is a view of the FIG. 1 wafer fragment at a processing step subsequent to that shown by FIG. 1.

Referring to FIG. 2, at least a portion of layer 16 has been etched in a halogenide, ozone and $H_2O$ comprising ambient. In the context of this document, a halogenide is from the group consisting of a fluoride, chloride, bromide, iodide, and mixtures thereof. Any suitable ambient is contemplated, as so literally worded, which is effective to produce such etching. One exemplary etching method is to provide a halogenide in a liquid solution to the portion of the layer to be etched, with ozone being provided to the portion of the layer in gaseous form, either as part of the liquid solution or separately. In the context of this document, "liquid solution" is defined as a solution wherein at least 70% by volume is in liquid form. One preferred liquid solution comprises HCl. Other preferred halogenide containing liquid solutions comprise liquid salt solutions, for example with respect to chloride having at least one of sodium chloride, potassium chloride or calcium chloride as chloride constituents. An exemplary preferred concentration range of the salt(s) within the solution is from about 0.1% to about 50% by weight, with from about 10% to about 40% by weight being more preferred.

One preferred method of providing a liquid solution for etching to the layer is by spraying an aqueous halogenide ion containing liquid solution onto the layer and providing gaseous ozone onto the layer during the spraying under conditions effective to etch at least a portion of the layer from the substrate. The liquid solution and ozone can be sprayed onto the layer from a single (common) emitter, but more preferably from separate emitters. A preferred etching ambient comprises a temperature of from about 5° C. to about 200° C., more preferably a temperature of at least 20° C., and even more preferably a temperature of at least 60° C. One preferred etching ambient pressure comprises atmospheric or slightly subatmospheric pressure (i.e., about 720 Torr). An alternate preferred etching ambient comprises a pressure greater than atmosphere, for example 2 atmospheres, 5 atmospheres, 10 atmospheres or greater. Greater degree subatmospheric pressures are also contemplated, but are believed to be less preferred. In one embodiment, the substrate is spun while the spraying action occurs.

By way of example only, preferred processing tools include spray and other tools that are advantageously capable of replenishing reagents on the wafer surface during a single process, and deliver fresh solutions for a maximum reaction rate (etch rate) at any given point in time. Such preferred tools may also facilitate removal of reaction products from the surface being etched. The invention was reduced-to-practice utilizing a Semitool Hydrazone processor, available from Semitool of Kalispell, Mont. The liquid solution utilized was 36% HCl and 64% water, by weight. Ozone was separately provided to the wafer surface from an ozone generator which produced 15 weight percent $O_3$ and 85 weight percent $O_2$. Twenty-five wafers were provided within the processor, and the $O_2$ feed to the generator was 6.5 liters per minute at 35 psi with 50 sccm of $N_2$ also being fed to the processor. Temperature was 90° C., and pressure was ambient atmospheric pressure. Fifteen minutes of etching under these conditions removed 400 Angstroms of an elemental platinum layer. Etching of a 400 Angstroms thick layer was, however, believed to be complete under such conditions in less than about five minutes.

Selectivity to photoresist in the etch is expected to be at least 2:1 and even at 20:1 or better, although this is in no way a requirement. Selectivity also is expected to be obtained relative to oxides, nitrides and other dielectrics and, perhaps, other metal materials.

By way of example only and not by way of limitation, a possible mechanism by which the above removal occurs is by ozone oxidation and dissolution of reaction products by the halogenide, with the metal(s) thereby being removed from the surface. The illustrated FIG. 2 processing shows only a portion of layer 16 being removed in the processing. Of course, in accordance with the claims, complete removal of layer 16 is contemplated also. Further, the illustrated "portion" shown to be removed in FIG. 2 includes a global outer portion. Alternate portions, by way of example only a complete section of layer 16, are also contemplated.

Figure 3:
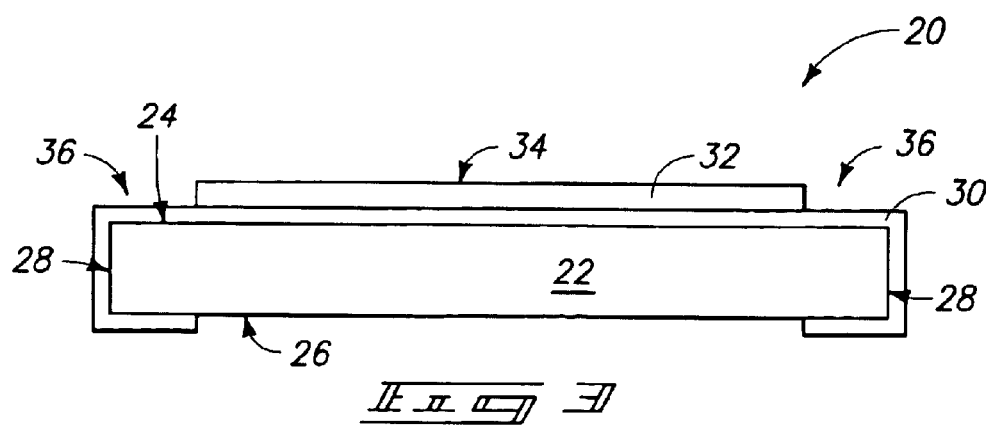
FIG. 3 is a diagrammatic perspective view of an alternate embodiment semiconductor wafer in process in accordance with an aspect of the invention.

By way of example only, an exemplary further implementation of aspects of the invention is described with reference to FIGS. 3 and 4. FIG. 3 depicts semiconductor wafer assembly 20 in process. Such comprises a semiconductor wafer 22, which is an exemplary semiconductor substrate. Wafer 22 includes one side 24, an opposing another side 26, and side edges 28. A layer 30 comprising at least one metal in elemental or metal alloy form is formed over at least one side of semiconductor wafer 22 and, preferably as shown, completely over one side 24, over side edges 28 and partially over opposing side 26. The attributes of layer 30 are as described above with respect to layer 16 of the first described embodiment.

Figure 4:
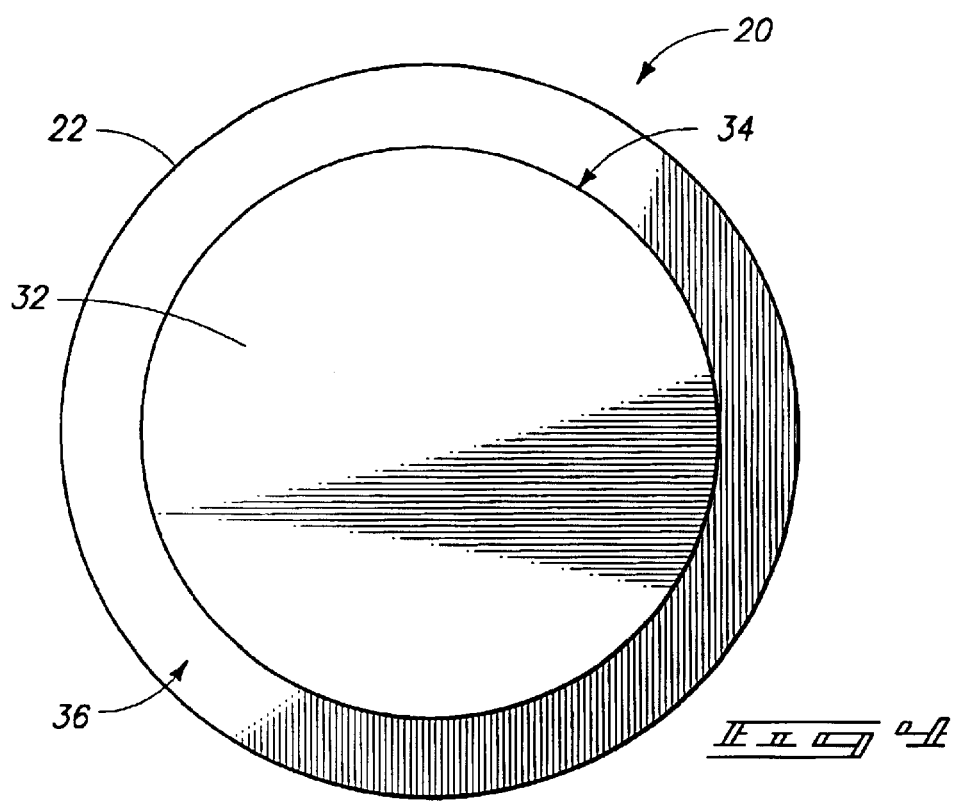
FIG. 4 is a top view of the FIG. 3 wafer.

Referring to FIGS. 3 and 4, a masking material 32 is formed over side 24 of semiconductor wafer 22. Exemplary preferred materials for masking material 32 include organic resist, for example photoresist. Wafer 22 can be considered as having a central portion 34 surrounded by a peripheral portion 36. In one preferred embodiment, peripheral or annular portion 36 is a front exclusion area on side 24 of semiconductor substrate 22 which might not be utilized in the fabrication of usable circuitry. An exemplary diameter for annulus area 36 is from 0.1 to 20 millimeters. Under conventional processing, such is a portion of the substrate which is typically not fabricated with usable circuitry due to conventional processing not resulting in consistent reproducible results in this area. Target film thicknesses and quality are typically degraded in this area, producing less than the desirable effects, and non-usable circuitry. However, it is difficult in the context of the prior art, particularly with the metals of the stated group in this invention, to remove such materials from the front, sides and backside of the semiconductor wafers. It is often desirable to completely remove these metals from the exclusion area, sides and backside of the wafer to prevent later undesired removal and contamination of the wafers.

Figure 5:
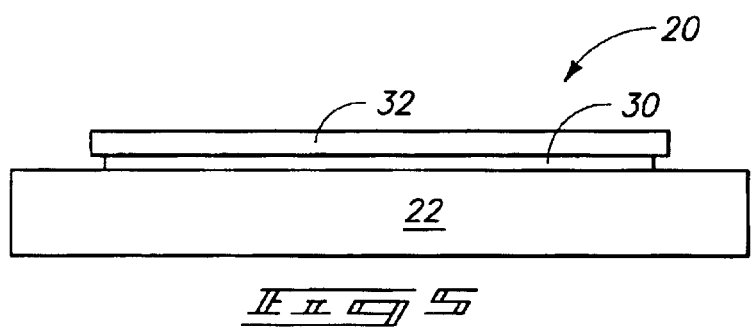
FIG. 5 is a view of the FIG. 3 wafer at a processing step subsequent to that shown by FIG. 3.

Referring to FIG. 5, peripheral exposed portion 36 is etched from the wafer using a halogenide, ozone and $H_2O$ comprising ambient while masking material 32 is received over central portion 34. Etching conditions, parameters and materials are as described above with respect to the etching of layer 16 in the first described embodiment. As shown in FIG. 5, such etching may be conducted isotropically and effective to etch some of layer 30 beneath masking material 32, and in the illustrated example, produce the depicted recessing.

Figure 6:
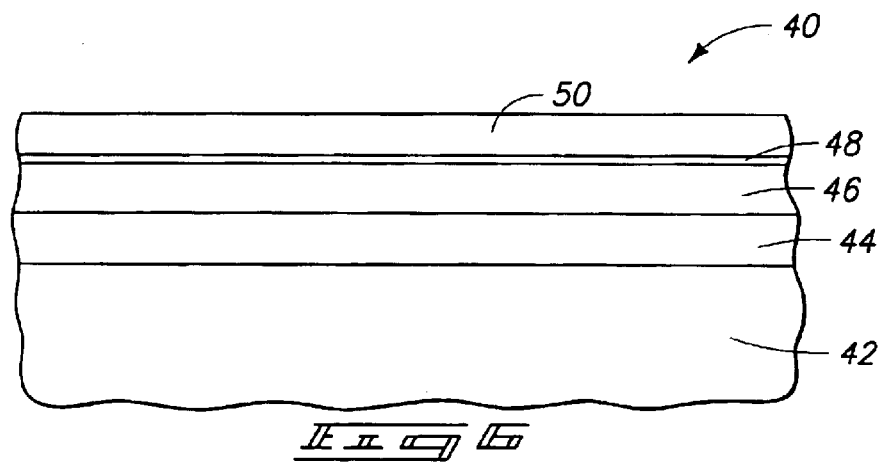
FIG. 6 is a diagrammatic perspective view of an alternate semiconductor wafer fragment/section in process in accordance with an aspect of the invention.

Another exemplary alternate embodiment of the invention is described with reference to FIGS. 6 and 7 in an exemplary method of forming a capacitor. FIG. 6 depicts a wafer fragment 40 comprising a bulk monocrystalline silicon substrate 42. An insulative layer 44 is formed thereover. First and second capacitor electrode layer 46 and 50, respectively, are formed and separated by a capacitor dielectric region 48 over substrate 42/44. At least one of layers 46 and 50 comprises at least one metal in elemental or metal alloy form, with the metal comprising an element selected from the group consisting of platinum, ruthenium, rhodium, palladium, iridium and mixtures thereof, such as with respect to layer 16 of the first described embodiment.

Referring to FIG. 7, masking material 54 is formed over a first portion 56 of the at least one capacitor electrode layer, while leaving a second portion 58 of the at least one capacitor electrode layer exposed. In the depicted embodiment, capacitor electrode layer 50 is being patterned. Alternately, of course, all of the depicted layers could be patterned, or layer 46 could comprise the subject at least one metal and be processed in accordance with the claimed invention prior to or after provision of layer 48. Masking material 54 is preferably the same as that described above with respect to the embodiment of FIGS. 3–5. The illustrated mask 54, for example, again can be produced by photolithographic methods or other methods, whether existing or yet-to-be-developed.

Referring to FIG. 8, exposed second portion 58 of capacitor electrode layer 50 is etched using a halogenide, ozone and $H_2O$ comprising ambient effective to form a desired pattern of the at least one capacitor electrode layer. Again, the etching conditions, parameters and materials are preferably as described above with respect to the etching of layer 16 of the first described embodiment, and of layer 30 of the second described embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
providing a semiconductor substrate comprising a layer comprising at least one metal in elemental or metal alloy form, the metal comprising an element selected from the group consisting of platinum, ruthenium, rhodium, palladium, iridium, and mixtures thereof; and
etching at least a portion of the layer in a halogenide, ozone and $H_2O$ comprising ambient.

2. The method of claim 1 wherein the halogenide is provided to the portion of the layer in a liquid solution, and the ozone is provided to the portion of the layer in gaseous form.

3. The method of claim 1 wherein the ambient comprises a temperature from about 5° C. to about 200° C.

4. The method of claim 1 wherein the ambient comprises a temperature of at least 20° C.

5. The method of claim 1 wherein the ambient comprises a temperature of at least 60° C.

6. The method of claim 1 wherein the at least one metal is in elemental form.

7. The method of claim 1 wherein the at least one metal is in metal alloy form.

8. The method of claim 1 wherein the at least one metal is in metal alloy form and includes at least two metals selected from the group consisting of platinum, ruthenium, rhodium, palladium and iridium.

9. The method of claim 1 wherein the at least one metal is in metal alloy form and includes at least one metal selected from the group consisting of platinum, ruthenium, rhodium, palladium and iridium, and at least one other not selected from the group consisting of platinum, ruthenium, rhodium, palladium and iridium.

10. The method of claim 1 wherein the layer consists essentially of said at least one metal in elemental or metal alloy form.

11. The method of claim 1 wherein the element comprises platinum.

12. The method of claim 1 wherein the element comprises ruthenium.

13. The method of claim 1 wherein the element comprises rhodium.

14. The method of claim 1 wherein the element comprises palladium.

15. The method of claim 1 wherein the element comprises iridium.

16. The method of claim 1 wherein the halogenide is provided to the portion of the layer in a liquid salt solution.

17. The method of claim 1 wherein the halogenide is provided to the portion of the layer in a liquid salt solution, the liquid salt solution comprising at least one of sodium chloride, potassium chloride and calcium chloride.

18. The method of claim 1 wherein the halogenide is provided to the portion of the layer in a liquid solution, the liquid solution comprising HCl.

19. The method of claim 1 wherein the etching ambient comprises atmospheric pressure.

20. The method of claim 1 wherein the etching ambient comprises a pressure greater than atmospheric.

21. A semiconductor processing method, comprising:
providing a semiconductor substrate comprising a layer comprising at least one metal in elemental or metal alloy form, the metal comprising an element selected from the group consisting of platinum, ruthenium, rhodium, palladium, iridium, and mixtures thereof; and
wet etching at least a portion of the layer using an aqueous halogenide ion containing liquid solution and ozone.

22. The method of claim 21 wherein the wet etching is conducted at a temperature of at least 20° C.

23. The method of claim 21 wherein the wet etching is conducted at a temperature of at least 60° C.

24. The method of claim 21 wherein the liquid solution comprises HCl.

25. The method of claim 21 wherein the liquid solution comprises HCl, and the wet etching is conducted at a temperature of at least 60° C.

26. The method of claim 21 wherein the liquid solution comprises at least one of sodium chloride, potassium chloride and calcium chloride.

27. The method of claim 21 wherein the liquid solution and the ozone are provided to the portion of the layer from separate emitters.

28. The method of claim 21 wherein the liquid solution and the ozone are provided to the portion of the layer from a common emitter.

29. The method of claim 21 wherein the element comprises at least one of platinum and rhodium.

30. A semiconductor processing method, comprising:
providing a semiconductor substrate comprising a layer comprising at least one metal in elemental or metal alloy form, the metal comprising an element selected from the group consisting of platinum, ruthenium, rhodium, palladium, iridium, and mixtures thereof; and
spraying an aqueous halogenide ion containing liquid solution onto the layer and providing gaseous ozone onto the layer during the spraying under conditions effective to etch at least a portion of the layer from the substrate.

31. The method of claim 30 wherein the element comprises at least one of platinum and rhodium.

32. The method of claim 30 wherein the liquid solution and the ozone are provided onto the layer from separate emitters.

33. The method of claim 30 wherein the liquid solution and the ozone are provided to the portion of the layer from a common emitter.

34. The method of claim 30 wherein the wet etching is conducted at a temperature of at least 20° C.

35. The method of claim 30 wherein the wet etching is conducted at a temperature of at least 60° C.

36. The method of claim 30 wherein the liquid solution comprises HCl.

37. The method of claim 30 wherein the liquid solution comprises HCl, and the wet etching is conducted at a temperature of at least 60° C.

38. The method of claim 30 wherein the liquid solution comprises at least one of sodium chloride, potassium chloride and calcium chloride.

39. The method of claim 30 further comprising spinning the substrate during the spraying.

40. A semiconductor processing method, comprising:
forming a layer comprising at least one metal in elemental or metal alloy form over at least one side of a semiconductor wafer, the metal comprising an element selected from the group consisting of platinum, ruthenium, rhodium, palladium, iridium, and mixtures thereof; the wafer having a central portion surrounded by a peripheral portion;
forming masking material over the central portion of the layer while leaving the peripheral portion outwardly exposed; and
etching the peripheral exposed portion of the layer from the wafer using a halogenide, ozone and $H_2O$ comprising ambient while the masking material is received over the central portion.

41. The method of claim 40 wherein the masking material comprises organic resist.

42. The method of claim 40 wherein the masking material comprises a photoresist.

43. The method of claim 40 wherein the masking material is inorganic.

44. The method of claim 40 wherein the semiconductor wafer comprises side edges and another side opposite the one side, the method further comprising forming said layer over at least a portion of the side edges and over at least a portion of the another side, the etching removing all of said layer from the side edges and the other side.

45. The method of claim 40 wherein the etching comprises wet etching using an aqueous halogenide ion containing liquid solution and gaseous ozone.

46. The method of claim 40 wherein the etching comprises spraying an aqueous halogenide ion containing liquid solution onto the masking material and the peripheral exposed portion and providing gaseous ozone onto the masking material and the peripheral exposed portion during the spraying.

47. The method of claim 40 wherein the etching is conducted isotropically effective to etch some of the layer beneath the masking material.

48. The method of claim 40 wherein the etching is conducted at a temperature of at least 20° C.

49. The method of claim 40 wherein the etching is conducted at a temperature of at least 60° C.

50. The method of claim 40 wherein the etching comprises a halogenide containing liquid solution comprising HCl.

51. The method of claim 40 wherein the etching comprises a chloride containing liquid solution comprising at least one of sodium chloride, potassium chloride and calcium chloride.

52. A method of forming a capacitor comprising:
forming first and second capacitor electrode layers separated by a capacitor dielectric region over a substrate, at least one of the capacitor electrode layers comprising at least one metal in elemental or metal alloy form, the metal comprising an element selected from the group consisting of platinum, ruthenium, rhodium, palladium, iridium, and mixtures thereof;
forming masking material over a first portion of said at least one capacitor electrode layer while leaving a second portion of said at least one capacitor electrode layer exposed; and etching the exposed second portion of said at least one capacitor electrode layer using a halogenide, ozone and $H_2O$ comprising ambient while the masking material is received over the first portion effective to form a desired pattern of said at least one capacitor electrode layer.

53. The method of claim 52 wherein the etching comprises wet etching using an aqueous halogenide ion containing liquid solution and gaseous ozone.

54. The method of claim 52 wherein the etching comprises spraying an aqueous halogenide ion containing liquid solution onto the masking material and the exposed second portion and providing gaseous ozone onto the masking material and the exposed second portion during the spraying.

55. The method of claim 52 wherein the etching is conducted isotropically effective to etch some of said at least one capacitor electrode layer beneath the masking material.

56. The method of claim 52 wherein the etching is conducted at a temperature of at least 20° C.

57. The method of claim 52 wherein the etching is conducted at a temperature of at least 60° C.

58. The method of claim 52 wherein the etching comprises a chloride containing liquid solution comprising HCl.

59. The method of claim 52 wherein the etching comprises a chloride containing liquid solution comprising at least one of sodium chloride, potassium chloride and calcium chloride.

* * * * *